United States Patent
Onozeki et al.

(10) Patent No.: US 10,893,616 B2
(45) Date of Patent: Jan. 12, 2021

(54) MULTILAYER PRINTED WIRING BOARD PRODUCTION METHOD, ADHESIVE LAYER-EQUIPPED METAL FOIL, METAL-CLAD LAMINATE, AND MULTILAYER PRINTED WIRING BOARD

(71) Applicant: HITACHI CHEMICAL COMPANY, LTD., Tokyo (JP)

(72) Inventors: Hitoshi Onozeki, Tokyo (JP); Tsubasa Inoue, Tokyo (JP); Katsuji Yamagishi, Tokyo (JP); Hiroshi Shimizu, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 130 days.

(21) Appl. No.: 15/751,218

(22) PCT Filed: Aug. 10, 2016

(86) PCT No.: PCT/JP2016/073513
§ 371 (c)(1),
(2) Date: Feb. 8, 2018

(87) PCT Pub. No.: WO2017/026501
PCT Pub. Date: Feb. 16, 2017

(65) Prior Publication Data
US 2018/0235090 A1    Aug. 16, 2018

(30) Foreign Application Priority Data

Aug. 11, 2015 (JP) .................................. 2015-158992
Aug. 11, 2015 (JP) .................................. 2015-158994

(51) Int. Cl.
*H05K 3/38* (2006.01)
*G03F 7/20* (2006.01)
(Continued)

(52) U.S. Cl.
CPC ............ *H05K 3/386* (2013.01); *C09J 163/00* (2013.01); *G03F 7/2002* (2013.01); *G03F 7/26* (2013.01);
(Continued)

(58) Field of Classification Search
CPC ........................................................ G03F 7/26
See application file for complete search history.

(56) References Cited

U.S. PATENT DOCUMENTS

2002/0096759 A1* 7/2002 Hirano ................ H01L 23/3737
257/706

FOREIGN PATENT DOCUMENTS

CN    1237873 A    12/1999
EP    1097806 A2    5/2001
(Continued)

*Primary Examiner* — Kathleen Duda
(74) *Attorney, Agent, or Firm* — Fitch, Even, Tabin & Flannery, LLP

(57) ABSTRACT

Disclosed is a production method of a multi-layered printed wiring board, including the following steps 1 to 3:
Step 1: a step of laminating, on a substrate with inner layer circuit, a metal foil with adhesive layer including a support, a metal foil having a thickness of 3 μm or less and ⅙ or less relative to the thickness of the inner layer circuit, and an organic adhesive layer having a thickness of 10 μm or less in this order, via an organic insulating resin layer such that the organic insulating resin layer and the organic adhesive layer are opposed to each other, and then releasing the support to form a laminated sheet (a) having the metal foil as an outer layer metal foil layer;
Step 2: a step of irradiating the laminated sheet (a) with a laser to bore the outer layer metal foil layer, the organic adhesive layer, and the organic insulating resin layer to form a bored laminated sheet (b) having a blind via hole; and (Continued)

Step 3: a step of forming an outer layer circuit connected with the inner layer circuit through the following steps 3-1 to 3-4:

Step 3-1: a step of etching removing the outer layer metal foil layer of the bored laminated sheet (b) formed in the step 2 and then forming an outer layer copper layer having a thickness of 2 μm or less on the bored laminated sheet (b);

Step 3-2: a step of forming a resist pattern by a resist applied on the outer layer copper layer;

Step 3-3: a step of forming a circuit layer on the surface of the outer layer copper layer on which the resist pattern is not formed, by electrolytic copper plating; and Step 3-4: a step of removing the resist pattern and then removing the exposed outer layer copper layer by etching, thereby forming an outer layer circuit connected with the inner layer circuit.

3 Claims, 1 Drawing Sheet

(51) Int. Cl.
  *H05K 3/46* (2006.01)
  *H05K 3/00* (2006.01)
  *C09J 163/00* (2006.01)
  *G03F 7/26* (2006.01)
  *H05K 3/06* (2006.01)
  *H05K 3/18* (2006.01)
  *H05K 3/42* (2006.01)
  *G03F 7/038* (2006.01)
  *H05K 1/11* (2006.01)

(52) U.S. Cl.
  CPC .......... *H05K 3/007* (2013.01); *H05K 3/0035* (2013.01); *H05K 3/061* (2013.01); *H05K 3/188* (2013.01); *H05K 3/4644* (2013.01); *H05K 3/4652* (2013.01); *H05K 3/4682* (2013.01); *G03F 7/038* (2013.01); *H05K 1/115* (2013.01); *H05K 3/429* (2013.01); *H05K 3/4673* (2013.01); *H05K 2203/0562* (2013.01); *H05K 2203/0723* (2013.01)

(56) References Cited

FOREIGN PATENT DOCUMENTS

| | | |
|---|---|---|
| JP | 04-003676 B2 | 1/1992 |
| JP | H10-247781 A | 9/1998 |
| JP | H11-87931 A | 3/1999 |
| JP | 11-346060 A | 12/1999 |
| JP | 2006-160994 A | 6/2006 |
| JP | 2011-051247 A | 3/2011 |
| JP | 2013-045858 A | 3/2013 |
| JP | 2015-036392 A | 2/2015 |
| JP | 2015-078422 A | 4/2015 |
| WO | 2014/157468 A1 | 10/2014 |

* cited by examiner

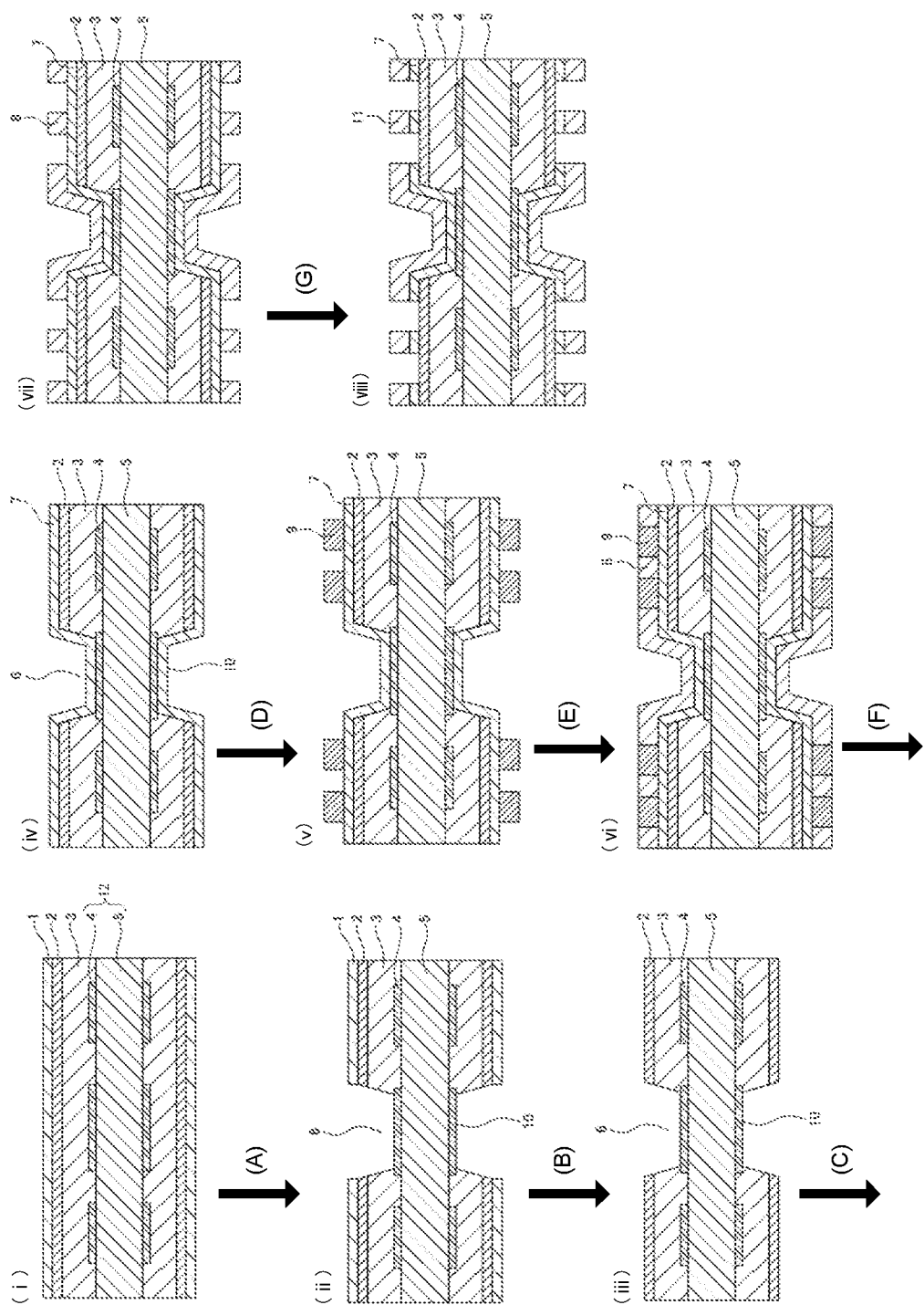

MULTILAYER PRINTED WIRING BOARD PRODUCTION METHOD, ADHESIVE LAYER-EQUIPPED METAL FOIL, METAL-CLAD LAMINATE, AND MULTILAYER PRINTED WIRING BOARD

CROSS-REFERENCE TO RELATED APPLICATIONS

This application is a U.S. national phase application filed under 35 U.S.C. § 371 of International Application No. PCT/JP2016/073513, filed Aug. 10, 2016, designating the United States, which claims benefit from Japanese Patent Application 2015-158992, filed Aug. 11, 2015, and Japanese Patent Application 2015-158994, filed Aug. 11, 2015, which are hereby incorporated herein by reference in their entirety.

TECHNICAL FIELD

The present invention relates a production method of a multi-layered printed wiring board, a metal foil with adhesive layer, a metal-clad laminated sheet, and a multi-layered printed wiring board.

BACKGROUND ART

In recent years, following miniaturization, weight reduction, and multi-functionalization of electronic devices, multi-layered printed wiring boards are required to achieve fine wiring and small-diameter of a via hole. It is difficult to perform boring in a diameter of 200 μm or less by means of mechanical drilling processing, and therefore, a laser has been widely used recently.

The formation of a via hole with a variety of lasers is frequently industrially adopted for printed wiring. But, in the case of forming a via hole on a laminated sheet having a thick copper foil as an outer layer, the copper surface reflects a laser beam, and therefore, boring is difficult. Accordingly, as disclosed in PTL 1, it is necessary to perform boring in such a manner that a copper foil is previously removed by etching only a portion of a hole having the same size of the via hole, and a laser beam is irradiated at a position from which the copper foil has been removed.

In addition, as disclosed in PTL 2, there is also a method in which an ultrathin copper foil is used, and boring is performed by directly irradiating a laser from the above of the copper foil. This method is a method in which after boring, a resist pattern is formed on the ultrathin copper foil; a plated copper layer is formed between the formed resist patterns; the resist pattern is then removed; and the ultrathin copper foil of the exposed outer layer is removed by means of acid etching, thereby forming a fine outer layer circuit connected with an inner layer circuit.

CITATION LIST

Patent Literature

PTL 1: JP 4-3676 B
PTL 2: JP 11-346060 A

SUMMARY OF INVENTION

Technical Problem

However, in the method described in PTL 1, boring patterning for laser irradiation is essential, so that a remarkable lowering of productivity was caused, as compared with the conventional production method of a multi-layered printed wiring board by means of mechanical drilling in which it is possible to perform boring directly from the above of the copper foil. In addition, there is also a method in which after a copper foil is subjected to half etching to make the thickness of the copper foil thin, boring with a laser is performed directly from the above of the copper foil; however, according to this method, it is necessary to etch the copper foil uniformly thin in a planar mode, and hence, a very high technique is required.

According to the method described in PTL 2, it is possible to perform boring with a laser directly from the above of the copper foil. But, on forming the outer layer circuit, it is necessary to finally remove the ultrathin copper foil as the outer layer by means of acid etching. However, the current ultrathin copper foil is thick, so that in forming a fine wiring with a line/space (L/S) ratio of less than 20/20 μm, there is involved such a problem that the etching quantity is large, and the line becomes thin.

An object of the present invention is to solve these problems of the background art and to provide a production method of a multi-layered printed wiring board capable of not only facilitating the formation of a via hole with a laser at the time of production of a multi-layered wiring board but also forming a fine outer layer circuit. Furthermore, another object of the present invention is to provide a metal foil with adhesive layer capable of being suitably used for this production method of a multi-layered printed wiring board, which is free from generation of an undercut on laser processing while securing good adhesiveness to plated copper, a metal-clad laminated sheet using the same, and a multi-layered printed wiring board.

Solution to Problem

As a result of investigations made by the present inventors regarding the aforementioned problems of the background art, it has been found that the foregoing problems can be solved by the following present invention.

Specifically, the present invention provides the following [1] to [8].

[1] A method of producing a multi-layered printed wiring board, including the following steps 1 to 3:

Step 1: a step of laminating, on a substrate with inner layer circuit, a metal foil with adhesive layer including a support, a metal foil having a thickness of 3 μm or less and ⅙ or less relative to the thickness of the inner layer circuit, and an organic adhesive layer having a thickness of 10 μm or less in this order, via an organic insulating resin layer such that the organic insulating resin layer and the organic adhesive layer are opposed to each other, and then releasing the support to form a laminated sheet (a) having the metal foil as an outer layer metal foil layer;

Step 2: a step of irradiating the laminated sheet (a) with a laser to bore the outer layer metal foil layer, the organic adhesive layer, and the organic insulating resin layer to form a bored laminated sheet (b) having a blind via hole; and Step 3: a step of forming an outer layer circuit connected with the inner layer circuit through the following steps 3-1 to 3-4:

Step 3-1: a step of etching removing the outer layer metal foil layer of the bored laminated sheet (b) formed in the step 2 and then forming an outer layer copper layer having a thickness of 2 μm or less on the bored laminated sheet (b);

Step 3-2: a step of forming a resist pattern by a resist applied on the outer layer copper layer;

Step 3-3: a step of forming a circuit layer on the surface of the outer layer copper layer on which the resist pattern is not formed, by electrolytic copper plating; and Step 3-4: a step of removing the resist pattern and then removing the exposed outer layer copper layer by etching, thereby forming an outer layer circuit connected with the inner layer circuit.

[2] The method of producing a multi-layered printed wiring board as set forth in the above [1], wherein a ten-point average surface roughness Rz of the surface of the metal foil on the side of the organic adhesive layer is 3.0 μm or less.

[3] The method of producing a multi-layered printed wiring board as set forth in the above [1] or [2], wherein a thermosetting resin composition containing an epoxy resin, a polymer component, an epoxy resin curing agent, a curing accelerator, and an inorganic filler having a specific surface area of 20 m$^2$/g or more, the content of the inorganic filler being 1 to 10 parts by mass based on 100 parts by mass of the epoxy resin, is used as the organic adhesive layer.

[4] A metal foil with adhesive layer including a metal foil having a thickness of 3 μm or less and an organic adhesive layer, wherein a thermosetting resin composition containing an epoxy resin, a polymer component, an epoxy resin curing agent, a curing accelerator, and an inorganic filler having a specific surface area of 20 m$^2$/g or more, the content of the inorganic filler being 1 to 10 parts by mass based on 100 parts by mass of the epoxy resin, is used as the organic adhesive layer.

[5] The metal foil with adhesive layer as set forth in the above [4], wherein a ten-point average surface roughness Rz of the surface of the metal foil on the side of the organic adhesive layer is 3.0 μm or less.

[6] The metal foil with adhesive layer as set forth in the above [4] or [5], wherein a thickness of the organic adhesive layer is 10 μm or less.

[7] A metal-clad laminated sheet produced by using the metal foil with adhesive layer as set forth in any of the above [4] to [6].

[8] A multi-layered printed wiring board produced by using the metal foil with adhesive layer as set forth in any of the above [4] to [6], or the metal-clad laminated sheet as set forth in the above [7].

Advantageous Effects of Invention

In accordance with the present invention, it is possible to provide a production method of a multi-layered printed wiring board capable of not only facilitating the formation of a via hole with a laser at the time of production of a multi-layered wiring board but also forming a fine outer layer circuit, whereby a production efficiency of a multi-layered printed wiring board having a fine outer layer circuit can be remarkably enhanced. Furthermore, it is possible to provide a metal foil with adhesive layer capable of being suitably used for this production method of a multi-layered printed wiring board, which is free from generation of an undercut on laser processing while securing good adhesiveness to plated copper, a metal-clad laminated sheet using the same, and a multi-layered printed wiring board.

BRIEF DESCRIPTION OF DRAWING

FIG. 1 is a view showing a production step of a multi-layered printed wiring board of the present invention.

DESCRIPTION OF EMBODIMENTS

[Production Method of Multi-layered Printed Wiring Board]

The production method of a multi-layered printed wiring board of the present invention includes the following steps 1 to 3.

Step 1: a step of laminating, on a substrate with inner layer circuit, a metal foil with adhesive layer including a support, a metal foil having a thickness of 3 μm or less and ⅙ or less relative to the thickness of the inner layer circuit, and an organic adhesive layer having a thickness of 10 μm or less in this order, via an organic insulating resin layer such that the organic insulating resin layer and the organic adhesive layer are opposed to each other, and then releasing the support to form a laminated sheet (a) having the metal foil as an outer layer metal foil layer;

Step 2: a step of irradiating the laminated sheet (a) with a laser to bore the outer layer metal foil layer, the organic adhesive layer, and the organic insulating resin layer to form a bored laminated sheet (b) having a blind via hole; and Step 3: a step of forming an outer layer circuit connected with the inner layer circuit through the following steps 3-1 to 3-4:

Step 3-1: a step of etching removing the outer layer metal foil layer of the bored laminated sheet (b) formed in the step 2 and then forming an outer layer copper layer having a thickness of 2 μm or less on the bored laminated sheet (b);

Step 3-2: a step of forming a resist pattern by a resist applied on the outer layer copper layer;

Step 3-3: a step of forming a circuit layer on the surface of the outer layer copper layer on which the resist pattern is not formed, by electrolytic copper plating; and Step 3-4: a step of removing the resist pattern and then removing the exposed outer layer copper layer by etching, thereby forming an outer layer circuit connected with the inner layer circuit.

An embodiment of the production method of a multi-layered printed wiring board of the present invention (hereinafter also referred to as "present embodiment") is hereunder described in more detail by reference to FIG. 1.

FIG. 1 is a view showing a production step of a multi-layered printed wiring board by the pattern plating method of the present embodiment.

In FIG. 1, 1 denotes an outer layer metal foil layer; 2 denotes an organic adhesive layer; 3 denotes an organic insulating resin layer; 4 denotes an inner layer circuit; 5 denotes an inner layer resin layer; 6 denotes a blind via hole; 7 denotes an outer layer copper layer; 8 denotes a circuit layer; 9 denotes a resist pattern; 10 denotes a pad; 11 denotes an outer layer circuit; and 12 denotes a substrate with inner layer circuit.

<Step 1>

In the step 1, a metal foil with adhesive layer including a support and a metal foil 1 in this order is laminated on a substrate 12 with inner layer circuit via an organic insulating resin layer 3 such that the organic insulating resin layer 3 and an organic adhesive layer 2 are opposed to each other, and the aforementioned support is released to form a laminated sheet (a) having the aforementioned metal foil 1 as the outer layer metal foil layer 1 (see FIG. 1(*i*)).

(Substrate 12 with Inner Layer Circuit)

The substrate 12 with inner layer circuit includes an inner layer circuit 4 and an inner layer resin layer 5.

The inner layer resin layer 5 is a layer in which the inner layer circuit 4 is formed on one surface or both surfaces thereof, and though its material quality is not limited, examples thereof include a glass epoxy base material, a glass polyimide base material, a glass polyester base material, an aramid epoxy base material, a composite base material, and the like.

The inner layer circuit 4 is a circuit layer which is formed on one surface or both surfaces of the inner layer resin layer 5. Examples of a metal which constitutes the inner layer circuit 4 include copper, nickel, aluminum, and the like, with copper being preferred from the viewpoints of handling properties, processability, and costs.

A thickness of the inner layer circuit 4 is preferably 6 times or more, more preferably 6 to 10 times, and still more preferably 6 to 8 times of the outer layer metal foil layer 1. When the thickness of the inner layer circuit 4 is 6 times or more of the outer layer metal foil layer 1, it is possible to inhibit occurrence of the matter that when a laser is irradiated to perform boring, the resultant does not withstand a high temperature of the laser, thereby causing a damage of the inner layer circuit 4 or generation of blistering of the lower side of the inner layer circuit 4.

From the viewpoints of productivity and formability of fine wiring while maintaining a relation with the thickness of the aforementioned outer layer metal foil layer 1, the thickness of the inner layer circuit 4 is preferably 10 to 30 µm, more preferably 12 to 25 µm, and still more preferably 15 to 20 µm.

(Metal Foil with Adhesive Layer)

The metal foil with adhesive layer is one including a support, the metal foil 1, and the organic adhesive layer 2 in this order.

[Metal Foil 1]

The metal foil 1 is disposed between the support and the organic adhesive layer 2 and serves as the outer layer metal foil layer 1 of the laminated sheet (a) which is formed in the step 1.

In the production method of the present embodiment, a thickness of the metal foil 1 is 3 µm or less and is ⅙ or less relative to the thickness of the inner layer circuit 4 of the substrate 12 with inner layer circuit. When the thickness of the metal foil 1 is ⅙ or less of the thickness of the inner layer circuit 4, on performing boring with a laser together with the outer layer metal foil layer 1, it is possible to inhibit occurrence of damaging not only the organic adhesive layer 2 and the organic insulating resin layer 3 but also the inner layer circuit 4. In addition, when the thickness of the metal foil 1 is 3 µm or less, it is possible to inhibit occurrence of the matter that a lot of burrs of the outer layer metal foil layer 1 after laser irradiation are generated, whereby the pore shape becomes instable.

When the thickness of the outer layer metal foil layer 1 is thick, though it is necessary to increase energy of the laser for performing boring, as the energy is more increased, the quantity of heat generation increases, and therefore, a damage of the resin between the outer layer metal foil layer 1 and the inner layer circuit 4 becomes large. When the thickness of the outer layer metal foil layer 1 is 3 µm or less, it is possible to inhibit occurrence of the matter that the energy to be given to the resin is too large, so that blistering of the surroundings of a via hole is generated. This blistering is caused due to melt and heat decomposition of the resin and becomes a defect in characteristics as the printed wiring board, and hence, such is not preferred. Thus, it is effective to allow the thickness of the outer layer metal foil layer 1 to fall within the aforementioned range.

As the metal foil 1, a copper foil, a nickel foil, an aluminum foil, and so on may be used. Among those, it is preferred to use a copper foil. The kind of the copper foil is not particularly limited, and an electrolytic copper foil, a rolled copper foil, and so on may be used.

As the metal foil 1, a peelable type metal foil may also be used, and an etchable type metal foil having an aluminum carrier or a nickel carrier may also be used in place of the peelable type metal foil. That is, the metal foil 1 may be a peelable type copper foil, nickel foil, or aluminum foil, or the like, and may also be an etchable type copper foil, nickel foil, or aluminum foil, or the like.

It is preferred that a ten-point average surface roughness Rz of the surface of the metal foil 1 on the side of the organic adhesive layer 2 is 3.0 µm or less. When the ten-point average surface roughness Rz is 3.0 µm or less, a metal portion invading into irregularities of the organic adhesive layer 2 may be reduced. Accordingly, the etching quantity may be reduced, so that formation of fine wirings becomes easy. The surface roughness of the metal foil 1 may be measured in conformity with JIS B0601:1994.

Examples of a commercially available product of the metal foil 1 include an F2-WS foil (a trade name for an electrolytic copper foil), manufactured by Furukawa Electric Co., Ltd., an MT18Ex foil (a trade name for an electrolytic copper foil), manufactured by Mitsui Mining & Smelting Co., Ltd.), and the like.

The metal foil 1 may be subjected to a rustproofing treatment, a chromate treatment, a silane coupling agent treatment, or the like, as the need arises.

[Support]

The support is a layer which is disposed on the surface of the metal foil 1 on the opposite side to the organic adhesive layer 2 and is a layer which is released after laminating the metal foil with adhesive layer on the substrate 12 with inner layer circuit.

In view of the fact that the metal foil with adhesive layer includes the support, even on the occasion of using an ultrathin metal foil having a thickness of 3 µm or less, the generation of wrinkles, folding, or the like at the time of treatment is inhibited, the handling becomes good.

As the support, a metal foil, such as a copper foil, an aluminum foil, etc., a plastic film of every kind, a release paper, and so on may be used. Among those, from the viewpoint of productivity, a copper foil is preferred. It is preferred that the support supports the metal foil 1 in a releasable state via the release layer.

[Organic Adhesive Layer 2]

The organic adhesive layer 2 is a layer which is disposed on the surface of the metal foil 1 on the opposite side to the support and is a layer which is laminated on the organic insulating resin layer 3 as described later.

As a resin composition which is used for the organic adhesive layer 2 (hereinafter also referred to as "resin composition for adhesive layer"), a known and customary resin composition which is used as an insulating material of a printed wiring board may be used, and it is preferred that a thermosetting resin with good heat resistance and chemical resistance is used as a base.

<<Thermosetting Resin>>

Examples of the thermosetting resin which is contained in the resin composition for adhesive layer include a phenol resin, an epoxy resin, a cyanate resin, a maleimide resin, an isocyanate resin, a benzocyclobutene resin, a vinyl resin, and the like. Among those, an epoxy resin is preferred. These may be used either alone or in combination of two or more thereof.

As the epoxy resin, it is preferred to contain a novolak type epoxy resin, and it is more preferred to contain a novolak type epoxy resin having a biphenyl structure. The novolak type epoxy resin having a biphenyl structure refers to a novolak type epoxy resin containing an aromatic ring of a biphenyl derivative in the molecule, and examples thereof include an epoxy resin represented by the following general formula (1).

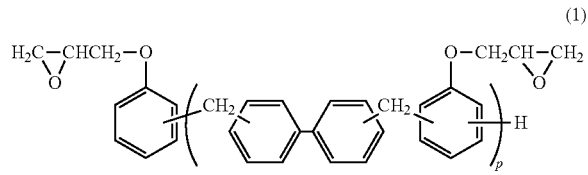

(1)

In the formula, p represents 1 to 5.

Examples of a commercially available product of the novolak type epoxy resin having a biphenyl structure include NC-3000 (a trade name for an epoxy resin represented by the formula (1) wherein p is 1.7) and NC-3000-H (a trade name for an epoxy resin represented by the formula (1) wherein p is 2.8), all of which are manufactured by Nippon Kayaku Co., Ltd., and the like.

<<Polymer Component>>

The resin composition for adhesive layer may contain a polymer component from the viewpoints of dielectric characteristics, impact resistance, and so on.

Examples of the polymer component include a crosslinked rubber particle, a thermoplastic resin, and the like.

Examples of the crosslinked rubber particle include a crosslinked acrylonitrile butadiene rubber particle, a crosslinked styrene butadiene rubber particle, an acrylic rubber particle, a core/shell type rubber particle, and the like.

Specific examples of the crosslinked acrylonitrile butadiene rubber (NBR) particle include an XER-91 Series (trade name, manufactured by JSR Corporation) and the like.

Specific examples of the crosslinked styrene butadiene rubber (SBR) particle include XSK-500 (trade name, manufactured by JSR Corporation) and the like.

Specific examples of the acrylic rubber particle include METABLEN (registered trademark) W300A and W450A (all of which are a trade name, manufactured by Mitsubishi Rayon Co., Ltd.), and the like.

Specific examples of the core/shell type rubber particle include STAFYROID (registered trademark) AC3832 and AC3816N (all of which are a trade name, manufactured by Gants Chemical Co., Ltd.), METABLEN (registered trademark) KW-4426 (trade name, manufactured by Mitsubishi Rayon Co., Ltd.), EXL-2655 (trade name, manufactured by Rohm & Haas Inc.), and the like.

These may be used either alone or in combination of two or more thereof.

Examples of the thermoplastic resin include polyvinyl acetal, a fluororesin, polyphenylene ether, modified polyphenylene ether, polyphenylene sulfide, polycarbonate, polyether imide, polyetheretherketone, polyarylate, polyamide, polyamide-imide, polybutadiene, and the like. These may be used either alone or in combination of two or more thereof. Among those, polyvinyl acetal is preferred.

In the case where the resin composition for adhesive layer contains the polymer component, its content is preferably 0.5 to 30 parts by mass, more preferably 2 to 20 parts by mass, and still more preferably 5 to 15 parts by mass based on 100 parts by mass of the thermosetting resin. When the content of the polymer component falls within this range, the resin composition for adhesive layer is high in the peel strength of a copper foil and the peel strength of electroless plating after chemical roughening and is excellent in the heat resistance, such as solder heat resistance, etc., and the insulation reliability.

<<Curing Agent>>

The resin composition for adhesive layer may contain a curing agent of the thermosetting resin, and in particular, in the case of containing an epoxy resin as the thermosetting resin, it is preferred to contain an epoxy resin curing agent.

Examples of the epoxy resin curing agent include an amine-based curing agent, a phenol resin-based curing agent, an acid anhydride-based curing agent, and the like. Among those, a phenol resin-based curing agent is preferred.

As the phenol resin-based curing agent, a novolak type phenol resin is preferred, and from the viewpoint of improvements in the peel strength of a copper foil and the peel strength of electroless plating after chemical roughening, a triazine ring-containing novolak type phenol resin is more preferred.

The triazine ring-containing novolak type phenol resin refers to a novolak type phenol resin including a triazine ring in a main chain of the novolak type phenol resin, and it may also be a cresol novolak type phenol rein including a triazine ring. The nitrogen content in the triazine ring-containing novolak type phenol resin is preferably 10 to 25% by mass, and more preferably 12 to 19% by mass. When the nitrogen content in the molecule falls within this range, a dielectric loss does not become excessively large, and in the case where the resin composition for adhesive layer is a varnish, the solubility in a solvent is good, and the residual amount of undissolved materials is suppressed. A number average molecular weight of the triazine ring-containing novolak type phenol resin is preferably 500 to 600. These may be used either alone or in combination of two or more thereof.

The triazine ring-containing novolak type phenol resin may be, for example, obtained by allowing phenol, an aldehyde, and a triazine ring-containing compound to react with each other under conditions at a pH of 5 to 9. On that occasion, when cresol is used in place of the phenol, a triazine ring-containing cresol novolak type phenol resin is obtained. As the cresol, any of o-, m-, and p-cresols may be used. As the triazine ring-containing compound, melamine, guanamine and a derivative thereof, cyanuric acid and a derivative thereof, and so on may be used.

Examples of a commercially available product of the triazine ring-containing novolak type phenol resin include PHENOLITE (registered trademark) LA-3018 (trade name, nitrogen content: 18% by mass), manufactured by DIC Corporation, that is a triazine ring-containing cresol novolak type phenol resin, and the like.

In the case where the resin composition for adhesive layer contains the curing agent, its content is determined according to the kind of the thermosetting resin and the like, and for example, in the case where the thermosetting resin contains the epoxy resin, the content is preferably 30 to 150 parts by mass, more preferably 50 to 100 parts by mass, and still more preferably 60 to 80 parts by mass based on 100 parts by mass of the epoxy resin. When the content of the epoxy resin curing agent falls within this range, the resin composition for adhesive layer is excellent in the curability, peel strength, heat resistance, such as solder heat resistance, etc., and insulation reliability.

<<Curing Accelerator>>

The resin composition for adhesive layer may contain a curing accelerator. Though the curing accelerator is not particularly limited, examples thereof include an imidazole of every kind; a tertiary amine, such as 1,8-diazabicycloundecene (DBU), etc.; and a $BF_3$ amine complex, all of which are a latent thermosetting agent, and the like. Among those, an imidazole and DBU are preferred from the standpoints of storage stability of the resin composition for adhesive layer, handling properties on revealing the B-stage, and solder heat resistance. Preferred examples of the imidazole include 2-phenyl imidazole, 2-ethyl-4-methyl imidazole, 1-cyanoethyl-2-phenyl imidazolium trimellitate, and the like.

In the case where the resin composition for adhesive layer contains the curing accelerator, its content is determined according to the kind of the thermosetting resin and the like, and for example, in the case where the thermosetting resin contains the epoxy resin, the content is preferably 0.01 to 5 parts by mass, more preferably 0.3 to 3 parts by mass, and still more preferably 0.5 to 1.5 parts by mass based on 100 parts by mass of the epoxy resin. When the content of the curing accelerator falls within this range, sufficient solder heat resistance, good storage stability of the resin composition for adhesive layer, and good handling properties on revealing the B-stage are obtained.

<<Inorganic Filler>>

The resin composition for adhesive layer may contain an inorganic filler. Examples of the inorganic filler include silica, alumina, barium sulfate, aluminum hydroxide, magnesium hydroxide, clay, talc, mica powder, calcium carbonate, magnesium carbonate, magnesium oxide, boron nitride, aluminum borate, barium titanate, strontium titanate, calcium titanate, bismuth titanate, titanium oxide, barium zirconate, calcium zirconate, antimony trioxide, antimony pentoxide, zinc oxide, glass powder, quartz powder, shirasu balloon, and the like. These may be used either alone or in combination of two or more thereof. Among those, silica is preferred.

A particle diameter of the inorganic filler is preferably 1 to 100 nm, more preferably 3 to 50 nm, and still more preferably 5 to 20 nm. The particle diameter may be measured by a particle size distribution measurement device.

A specific surface area of the inorganic filler is preferably 20 m$^2$/g or more. In the case where the specific surface area is 20 m$^2$/g or more, an area of an interface between the inorganic filler and the resin becomes large, and on the occasion of laser processing, the heat may be efficiently transmitted, and therefore, an effect for inhibiting an undercut is revealed favorably. From the same viewpoint, the specific surface area of the inorganic filler is more preferably 30 to 150 m$^2$/g, and still more preferably 50 to 130 m$^2$/g.

The specific surface area may be, for example, measured by the BET method based on physical adsorption of an inactive gas at low temperature and low humidity.

In order to improve the humidity resistance, the inorganic filler is preferably one having been subjected to a surface treatment with a surface treating agent, such as a silane coupling agent, etc. In addition, in order to improve the dispersibility, the inorganic filler is preferably one having been subjected to a hydrophobization treatment.

In the case where the resin composition for adhesive layer contains the inorganic filler, its content is preferably 1 to 20 parts by mass, more preferably 1 to 15 parts by mass, still more preferably 1 to 10 parts by mass, and especially preferably 4 to 10 parts by mass based on 100 parts by mass of the thermosetting resin. When the content of the inorganic filler falls within the aforementioned range, a difference in thermal conductivity from a glass cloth-incorporated base material, such as a prepreg, etc., is large, so that on performing laser processing, an undercut is not generated. In addition, it is possible to inhibit worsening of adhesive strength, plating characteristics, and interlayer insulation reliability, which is caused due to the matter that the amount of the inorganic filler which is exposed on the surface increases.

Examples of a commercially available product of the inorganic filler having a specific surface area of 20 m$^2$/g or more include AEROSIL (registered trademark) R972 (trade name) (specific surface area: 110±20 m$^2$/g (a catalogue value)) and AEROSIL (registered trademark) R202 (trade name) (specific surface area: 100±20 m$^2$/g (a catalogue value)) (all of which are manufactured by Nippon Aerosil Co., Ltd.), all of which are fumed silica; PL-1 (trade name) (specific surface area: 181 m$^2$/g) and PL-7 (trade name) (specific surface area: 36 m$^2$/g) (all of which are manufactured by Fuso Chemical Co., Ltd.); and the like.

<<Other Components>>

The resin composition for adhesive layer may contain, in addition to the aforementioned respective components, a flame retardant, a coloring agent, a levelling agent, a defoaming agent, an ion trapping agent, an ultraviolet impermeable agent, an antioxidant, a reducing agent, a thixotropy-imparting agent, a surfactant, a coupling agent, or the like, as the need arises.

A suitable specific embodiment of the resin composition for adhesive layer is a thermosetting resin composition containing an epoxy resin, a polymer component, an epoxy resin curing agent, a curing accelerator, and an inorganic filler having a specific surface area of 20 m$^2$/g or more, the content of the inorganic filler being 1 to 10 parts by mass based on 100 parts by mass of the epoxy resin.

More specifically, for example, a thermosetting resin composition containing 60 to 80 parts by mass of a triazine ring-containing cresol novolak type phenol resin (nitrogen content: 18% by mass, hydroxyl group equivalent: 151 g/mol) as the epoxy resin curing agent, 5 to 15 parts by mass of a carboxylic acid-modified acrylonitrile butadiene rubber particle as the polymer component, 0.01 to 5 parts by mass of 1,8-diazabicycloundecene as the curing accelerator, and 6 to 10 parts by mass of fumed silica as the inorganic filler having a specific surface area of 20 m$^2$/g or more based on 100 parts by mass of a novolak type epoxy resin having a biphenyl structure as the epoxy resin is preferred.

The resin composition for adhesive layer is, for example, obtained by thoroughly stirring and mixing the aforementioned respective components and then allowing the mixture to stand until foams disappear. In the case where the resin composition for adhesive layer contains the inorganic filler, for the purpose of uniformly dispersing the inorganic filler, a kneading or dispersing method using a known mixer, such as a kneader, a ball mill, a bead mill, a triple roll mill, a nanomizer, etc., may be applied.

From the standpoint of workability, it is preferred that the resin composition for adhesive layer is formed in a varnish by mixing in a solvent to perform dilution or dispersing. As the solvent, methyl ethyl ketone, xylene, toluene, acetone, ethylene glycol monoethyl ether, cyclohexanone, ethoxyethyl propionate, N,N-dimethylformamide, N,N-dimethylacetamide, and so on may be used. These may be used either alone or in combination of two or more thereof.

A blending proportion of the solvent to the resin composition for adhesive layer may be regulated according to equipment for formation of a coating film of the resin composition for adhesive layer, or the like.

As a method of forming the organic adhesive layer 2, for example, the organic adhesive layer 2 may be formed in a semi-cured state by applying the varnish of the resin composition for adhesive layer on the surface of the metal foil 1 with support, followed by heating. Examples of a method of applying the varnish include a method of applying the varnish using a comma coater, a gravure coater, a die coater, or the like.

A thickness of the organic adhesive layer 2 is 10 μm or less, preferably 1 to 7 μm, and more preferably 2 to 5 μm. When the thickness of the organic adhesive layer 2 is 10 μm or less, the heat resistance and low thermal expansion coefficient of the organic adhesive layer 2 may be kept good.

The laminated sheet (a) including the metal foil 1 as the outer layer metal foil layer 1 may be obtained by disposing the thus obtained metal foil with adhesive layer on one surface or both surfaces of the substrate 12 with inner layer circuit via the organic insulating resin layer 3 such that the organic insulating resin layer 3 and the organic adhesive layer 2 are opposed to each other, and then heat molding at, for example, 150 to 300° C. to perform lamination, followed by releasing the support (see FIG. 1(*i*)).

After releasing the support, by subjecting the surface of the outer layer metal foil layer 1 to a blackening treatment, a reductive blackening treatment, a CZ treatment (Mec Co., Ltd.), or the like, to perform a fine toughening treatment on the surface, thereby enhancing absorbability of a laser and enabling boring with a laser as described later to be facilitated.

<Organic Insulating Resin Layer 3>

The organic insulating resin layer 3 is a layer interposing between the inner layer circuit 4 and the organic adhesive layer 2, and a known prepreg obtained by impregnating or coating a base material with a resin composition may be used. As the base material, a well-known base material which is used for a laminated sheet for electric insulating material of every kind may be used. Examples thereof include an inorganic fiber of E-glass, D-glass, S-glass, Q-glass, etc.; an organic fiber of a polyimide, a polyester, polytetrafluoroethylene, etc.; and a mixture thereof and the like. Examples of a shape of the base material include a woven fabric, a nonwoven fabric, a roving, a chopped strand mat, a surfacing mat, and the like. The material quality and shape of the base material are selected according to an application or performance of the target molded article, and two or more material qualities and shapes may be combined, as the need arises. Though a thickness of the base material is not particularly limited, in general, a base material having a thickness of about 0.01 to 0.5 mm may be used. In addition, a base material having been subjected to a surface treatment with a silane coupling agent or the like, or a base material having been subjected to a mechanical opening treatment is preferred from the standpoints of heat resistance, humidity resistance, and processability.

As the resin composition which is used for the organic insulating resin layer 3, a known resin composition which is used as an insulating material of a printed wiring board may be used. In general, a thermosetting resin with good heat resistance and chemical resistance is used as the base. Examples of the thermosetting resin include a phenol resin, an epoxy resin, a cyanate resin, a maleimide resin, an isocyanate resin, a benzocyclobutene resin, a vinyl resin, and the like, but it should not be construed that the thermosetting resin is limited thereto. These may be used either alone or in combination of two or more thereof.

<Step 2>

The step 2 is a step of irradiating the laminated sheet (a) obtained in the step 1 with a laser to bore the outer layer metal foil layer 1, the organic adhesive layer 2, and the organic insulating resin layer 3 to form a bored laminated sheet (b) having a blind via hole 6 (see FIG. 1(*ii*)).

As the laser which is used for boring, a carbon dioxide gas laser, a YAG laser, a UV laser, an excimer laser, and so on are generally used, and from the viewpoint of processability, a carbon dioxide gas laser is preferred. As the carbon dioxide gas laser, for example, LC-L series (trade name), manufactured by Via Mechanics, Ltd.; ML605GT series and ML505DT series (all of which are a trade name), manufactured by Mitsubishi Electric Corporation; and the like may be used. In addition, after boring, a desmear treatment may be performed, as the need arises.

<Step 3>

The step 3 is a step of forming an outer layer circuit 11 connected with the inner layer circuit 4 through the following steps 3-1 to 3-4.

Step 3-1: A step of etching removing the outer layer metal foil layer 1 of the bored laminated sheet (b) formed in the step 2 and then forming an outer layer copper layer 7 having a thickness of 2 μm or less on the bored laminated sheet (b).

Step 3-2: A step of forming a resist pattern 9 by a resist applied on the outer layer copper layer 7.

Step 3-3: A step of forming a circuit layer 8 on the surface of the outer layer copper layer 7 on which the resist pattern 9 is not formed, by electrolytic copper plating.

Step 3-4: A step of removing the resist pattern 9 and then removing the exposed outer layer copper layer 7 by etching, thereby forming the outer layer circuit 11 connected with the inner layer circuit 4.

(Step 3-1)

In the step 3-1, after etching removing the outer layer metal foil layer 1 of the bored laminated sheet (b) formed in the step 2, the outer layer copper layer 7 having a thickness of 2 μm or less is formed on the bored laminated sheet (b).

As for the etching of the outer layer metal foil layer 1, for example, in the case of using a copper foil as the metal foil, acid etching may be performed at a temperature of 50° C. by using a solution including 100 g/L of cupric chloride ($CuCl_2$) and free hydrochloric acid in a concentration of 100 g/L (see FIG. 1(*iii*)).

Subsequently, on the surface of the etched bored laminated sheet (b), electroless plating with an electroless copper plating solution (trade name: CUPRACID HL, manufactured by Atotech Japan K.R.) is performed at a liquid temperature of 20 to 40° C. for 5 to 15 minutes, to form the outer layer copper layer 7 (plated layer) (see FIG. 1(*iv*)). The outer layer copper layer 7 is also formed on the surfaces of the organic adhesive layer 2 and the organic insulating resin layer 3 of the blind via hole. The outer layer copper layer 7 is formed mainly on the organic adhesive layer 2 having strong adhesion to the plated copper, and therefore, as compared with the case of plating the outer layer copper layer 7 directly on the organic insulating resin layer 3, a high adhesive strength is obtained between the organic insulating resin layer 3 and the outer layer metal foil layer 1.

From the viewpoints that the etching quantity is small and that it is made possible to form a finer circuit, a thickness of the outer layer copper layer 7 is 2 μm or less, preferably 0.1 to 1.5 μm, more preferably 0.2 to 1 μm, and still more preferably 0.3 to 0.7 μm.

(Step 3-2)

A resist is applied on the surface of the thus formed outer layer copper layer 7, to form a resist pattern 9.

The resist pattern 9 may be formed by a known method. For example, the resist pattern 9 may be formed in a manner in which a photoresist is laminated on the outer layer copper layer 7, and the photoresist surface is exposed with light by using an exposure machine and using a mask having a predetermined circuit formed thereon, thereby forming an exposed area and a non-exposed area, followed by development with a 1% $Na_2CO_3$ solution (see FIG. 1(v)). As the photoresist, RY-5319 (trade name), manufactured by Hitachi Chemical Co., Ltd., and so on may be used.
(Step 3-3)

Subsequently, a circuit layer 8 is formed on the surface of the outer layer copper layer 7 on which the resist pattern 9 is not formed, by electrolytic copper plating (see FIG. 1(vi)).

The electrolytic copper plating may be, for example, performed on the outer layer copper layer 7 on which the resist pattern 9 is not formed (namely, between the resist patterns 9 and on the surface of the blind via hole), by using a solution including 30 to 100 g/L of copper and 50 to 200 g/L of sulfuric acid under conditions at a temperature of 20 to 80° C. and a cathode current density of 1 to 100 $A/dm^2$.
(Step 3-4)

Subsequently, after removing the resist pattern 9, the exposed outer layer copper layer 7 is removed by etching, thereby forming the outer layer circuit 11 connected with the inner layer circuit 4.

The resist pattern 9 may be, for example, dissolved and removed by a usual method using a 3% NaOH solution, and according to this, not only the circuit layer 8 is formed, but also the outer layer copper layer 7 is exposed between the circuit layers 8 (see FIG. 1(vii)).

Subsequently, the exposed outer layer copper layer 7 is removed by etching. In the present embodiment, the thickness of the outer layer copper layer 7 is extremely thin as compared with a generally used copper foil, and therefore, the outer layer copper layer 7 may be dissolved in a short time through a treatment with a general flash etching liquid (hydrogen peroxide/sulfuric acid-based etching liquid). Accordingly, the outer layer circuit 11 may be formed by removing the outer layer copper layer 7 between the circuit layers 8 without protecting the circuit layer 8 by means of tin plating (see FIG. 1(viii)). In this way, in the production method of the present invention, the outer layer copper layer 7 to be used is thinner than a conventional copper foil, and therefore, the etching quantity is small, and it is possible to form a finer circuit.

The production method of the present invention is also applicable to a multi-layered substrate with inner layer circuit of three or more layers. In addition, by repeating the respective steps, it is possible to perform multi-layering of the layer having a blind via hole, and the production method of the present invention is applicable to production of a multi-layered printed wiring board having an arbitrary number of layers.
[Metal Foil with Adhesive Layer]

The metal foil with adhesive layer of the present invention is a metal foil with adhesive layer including a metal foil having a thickness of 3 μm or less and an organic adhesive layer, wherein a thermosetting resin composition containing an epoxy resin, a polymer component, an epoxy resin curing agent, a curing accelerator, and an inorganic filler having a specific surface area of 20 $m^2/g$ or more, the content of the inorganic filler being 1 to 10 parts by mass based on 100 parts by mass of the epoxy resin, is used as the organic adhesive layer.

By applying the metal foil with adhesive layer of the present invention to the production method of a multi-layered printed wiring board, it is possible to produce a multi-layered printed wiring board which is not only small in the surface roughness but also free from generation of an undercut on laser processing while securing good adhesiveness to plated copper. Accordingly, the metal foil with adhesive layer of the present invention may be suitably used for the production method of a multi-layered printed wiring board of the present invention.

Suitable embodiments of the metal foil and the organic adhesive layer, all of which constitute the metal foil with adhesive layer of the present invention, are the same as the suitable embodiments of the metal foil and the organic adhesive layer as described in the production method of a multi-layered printed wiring board of the present embodiment.
[Metal-Clad Laminated Sheet and Multi-Layered Printed Wiring Board]

The metal-clad laminated sheet of the present invention is one using the metal foil with adhesive layer of the present invention.

In addition, the multi-layered printed wiring board of the present invention is one using the metal foil with adhesive layer of the present invention, or the metal-clad laminated sheet of the present invention.

The metal-clad laminated sheet of the present invention may be produced by the step 1 in the production method of a multi-layered printed wiring board of the present embodiment, and the respective constitutional members and suitable production conditions are those as described in the production method of a multi-layered printed wiring board of the present embodiment.

In addition, the multi-layered printed wiring board of the present invention may be produced by the aforementioned production method of a multi-layered printed wiring board of the present embodiment, and the respective constitutional members and suitable production conditions are those as described in the production method of a multi-layered printed wiring board of the present embodiment.

EXAMPLES

The present invention is specifically described below by reference to Examples, but it should not be construed that the present invention is limited thereto.
[Production of Resin Composition for Adhesive Layer]

Production Example 1

Respective components as described below were mixed to obtain a varnish of a resin composition A for adhesive layer (solid concentration: about 70% by mass).
[Thermosetting Resin]

Novolak type epoxy resin having a biphenyl structure: NC-3000-H (trade name, manufactured by Nippon Kayaku Co., Ltd.): 100 parts by mass
[Polymer Component]

Carboxylic acid-modified acrylonitrile butadiene rubber particle: XER-91SE-15 (trade name, manufactured by JSR Corporation): 10 parts by mass
[Epoxy Resin Curing Agent]

Triazine ring-containing cresol novolak type phenol resin: PHENOLITE (registered trademark) LA-3018-50 (trade name, nitrogen content: 18% by mass, hydroxyl group equivalent: 151 g/mol, manufactured by DIC Corporation): 70 parts by mass

[Curing Accelerator]
Imidazole derivative compound (1-cyanoethyl-2-phenyl imidazolium trimellitate): 2PZ-CNS (trade name, manufactured by Shikoku Chemicals Corporation): 1 part by mass
[Solvent]
Methyl ethyl ketone
[Production of Multi-Layered Printed Wiring Board]

Example 1

On the surface of an ultrathin copper foil having a copper foil as a support (copper foil thickness of support: 18 μm, thickness of ultrathin copper foil: 3 μm, manufactured by Mitsui Mining & Smelting Co., Ltd., trade name: MT18Ex-3, surface roughness of roughened surface Rz=2.0 μm), the varnish of the composition A for adhesive layer obtained in Production Method 1 was applied and dried at 170° C. for about 10 minutes, thereby obtaining an ultrathin copper foil with adhesive layer. A thickness of the formed organic adhesive layer was 3.0 μm.

Subsequently, on both surfaces of a substrate with inner layer circuit, on both surfaces of which a blackening-treated inner layer circuit had been formed (material quality: copper, thickness of circuit: 18 μm (on the both surfaces)) (manufactured by Hitachi Chemical Co., Ltd., trade name: MCL-679FG, thickness: 0.5 mm), the above-obtained ultrathin copper foil with adhesive layer was superimposed such that the organic adhesive layer and the inner layer circuit were opposed to each other and molded using a vacuum press under conditions at 185° C. and a pressure of 20 kg/cm$^2$ for 60 minutes, and the support was then released to obtain a four-layered sheet with inner layer circuit (laminate (a)).

Subsequently, at a predetermined position of the outer layer copper foil of the four-layered sheet with inner layer circuit (laminate (a)), a laser beam was irradiated in four shots under conditions of a beam diameter of 220 μm, a current of 12 A, and a pulse width of 50 μm by using a carbon dioxide gas laser (manufactured by Mitsubishi Electric Corporation, trade name: ML505DT), to form a blind via hole, thereby obtaining a bored four-layered sheet (bored laminated sheet (b)).

Subsequently, the outer layer copper layer of this bored four-layered sheet (bored laminated sheet (b)) was removed by etching with cupric chloride, and the surface of this bored four-layered sheet was subjected to electroless plating with an electroless copper plating solution (manufactured by Atotech Japan K.K., trade name: CUPRACID (registered trademark) HL) at a liquid temperature of 30° C. for 8 minutes, thereby forming a plated layer (outer layer copper layer) having a thickness of about 0.5 μm.

On the surface of the thus formed outer layer copper layer, a photoresist (manufactured by Hitachi Chemical Co., Ltd., trade name: RY-5319) was laminated, and the photoresist surface was irradiated with an exposure machine by using a mask having a predetermined circuit formed thereon, thereby forming an exposed area and a non-exposed area. After exposure, the resultant was developed with a 1% Na$_2$CO$_3$ solution, to form a resist pattern.

Subsequently, the surface of the outer layer copper layer on which a resist pattern was not formed was subjected to electrolytic copper plating with a copper sulfate bath under conditions at a liquid temperature of 25° C. and a current density of 1.0 A/dm$^2$, thereby forming a circuit layer of copper having a thickness of 10 μm. After completion of the plating, the resist pattern was dissolved and removed using a 3% NaOH solution, thereby exposing the outer layer copper layer. Subsequently, the outer layer copper layer was dissolved with a flash etching liquid (hydrogen peroxide/sulfuric acid-based etching liquid), thereby forming a fine outer layer circuit with a line/space (L/S) ratio of 10/10 μm.

Comparative Example 1

A copper foil with adhesive layer was obtained in the same manner as in Example 1, except that in the ultrathin copper foil with adhesive layer as used in Example 1, the ultrathin copper foil having a thickness of 3 μm was replaced by a copper foil having a thickness of 9 μm (manufactured by Mitsui Mining & Smelting Co., Ltd., trade name: 3EC-VLP). Subsequently, a four-layer sheet with inner layer circuit was obtained in the same manner as in Example 1 by using the foregoing copper foil with adhesive layer and a substrate with inner layer circuit, on both surfaces of which a blackening-treated inner layer circuit had been formed (thickness of circuit: 35 μm (on the both surfaces)) (manufactured by Hitachi Chemical Co., Ltd., trade name: MCL-679FG, thickness: 0.5 mm).

At a predetermined position of the outer layer copper foil of the obtained four-layered sheet with inner layer circuit, a carbon dioxide gas laser was irradiated under the same conditions as in Example 1. However, even when the laser beam was irradiated in eight shots, a value of which is twice of that in Example 1, the formation of a blind via hole was instable, and the formation of a blind via hole was occasionally impossible depending upon the position. In addition, when the shot number was increased, the damage of resin to be caused due to heat of the laser was vigorous, so that even in the case where a via hole was successfully formed, as compared with an opening of the surface of the outer layer copper foil, a large hole was formed in the resins of the organic adhesive layer and the organic insulating resin layer just beneath of the outer layer copper foil, and the outer layer copper foil became in a state where an undercut was formed, thereby constituting a remarkable hindrance in the plating in a post-step.

Comparative Example 2

A four-layer sheet with inner layer circuit was produced in the same manner as in Example 1, except that in Example 1, a copper foil having a thickness of 9 μm (manufactured by Mitsui Mining & Smelting Co., Ltd., trade name: 3EC-VLP) was used as the copper foil for forming the inner layer circuit of the four-layer sheet with inner layer circuit.

At a predetermined position of the outer layer copper foil of the obtained four-layered sheet with inner layer circuit, a laser was irradiated in the same shot number under the same conditions as in Example 1. In terms of appearance, the same blind via hole as in Example 1 was formed; however, when observing the cross section, delamination was observed between the inner layer circuit of the laser-irradiated part and the inner layer base material. This delamination further grew by heat of a solder reflow and was occasionally a serious defect of finally resulting in conduction breakage of the via.

Comparative Example 3

A four-layered sheet with inner layer circuit was produced in the same manner as in Example 1, except that in Example 1, the thickness of the organic adhesive layer of the ultrathin copper foil with adhesive layer was changed to 15 μm.

At a predetermined position of the outer layer copper foil of the obtained four-layered sheet with inner layer circuit, a laser was irradiated in the same shot number under the same conditions as in Example 1. In terms of appearance, the same blind via hole as in Example 1 was formed; however, after a hygroscopic treatment (under conditions at 121° C., a humidity of 100%, and 2 atm for 2 hours), delamination was caused in this bored four-layered sheet due to a heat treatment of solder reflow.

Comparative Example 4

After producing a bored four-layer sheet by the same method as in Example 1, on the outer layer copper foil (ultrathin copper foil having a thickness of 3 μm) of this surface, a photoresist (manufactured by Hitachi Chemical Co., Ltd., trade name: RY-5319) was laminated by a conventionally known method. That is, in Example 1, after etching removing the ultrathin copper foil, electroless plating was performed to form the photoresist on the foregoing plated layer; however, in Comparative Example 4, the photoresist was laminated directly on the ultrathin copper foil. Thereafter, the photoresist surface was exposed with light by using an exposure machine and using a mask having a predetermined circuit formed thereon, thereby forming an exposed area and a non-exposed area. After exposure, the resultant was developed with a 1% $Na_2CO_3$ solution, to form a resist pattern.

Subsequently, the surface of the outer layer copper foil on which a resist pattern was not formed was subjected to electroless copper plating and electrolytic copper plating by the same method as in Example 1, thereby forming a circuit layer of copper. After completion of the plating, the resist pattern was dissolved and removed using a 3% NaOH solution, thereby exposing the outer layer copper layer. Subsequently, the outer layer copper foil was dissolved with a flash etching liquid (hydrogen peroxide/sulfuric acid-based etching liquid), thereby forming a fine outer layer circuit with a line/space (L/S) ratio of 10/10 μm. But, there was a place where a part of the lines became thin, and a place where the line fell was confirmed, too.

From the aforementioned results of the Example and Comparative Examples, it is noted that according to the production method of a multi-layered printed wiring board of the present invention, the formation of a blind via hole upon irradiation with a laser becomes easy, and the obtained blind via hole does not adversely affect the subsequent production step of a multi-layered printed wiring board.

In addition, it is also noted that on forming an outer layer circuit, by disposing the organic adhesive layer having high adhesiveness to plated copper between the ultrathin copper foil and the organic insulating resin layer, the plated layer serving as the substrate can be made extremely thin, and it becomes possible to form a fine wiring.

Next, the matter that by applying the metal foil with adhesive layer of the present invention to the production method of a multi-layered printed wiring board, it is possible to produce a multi-layered printed wiring board which is not only small in the surface roughness but also free from generation of an undercut on laser processing while securing good adhesiveness to plated copper is specifically described by reference to Examples, but it should not be construed that the present invention is limited thereto.

[Production of Resin Composition for Adhesive Layer]

Production Example 2

Respective components as described below were mixed using a dispersing machine (manufactured by Yoshida Kikai Co., Ltd., trade name: NANOMIZER (registered trademark)) to obtain a varnish of a resin composition B for adhesive layer (solid concentration: about 35% by mass).

[Thermosetting Resin]

Novolak type epoxy resin having a biphenyl structure: NC-3000S-H (trade name, manufactured by Nippon Kayaku Co., Ltd.): 100 parts by mass

[Polymer Component]

Carboxylic acid-modified acrylonitrile butadiene rubber particle: XER-91SE-15 (trade name, manufactured by JSR Corporation): 10 parts by mass

[Epoxy Resin Curing Agent]

Triazine ring-containing cresol novolak type phenol resin: PHENOLITE (registered trademark) LA-3018-50 (trade name, nitrogen content: 18% by mass, hydroxyl group equivalent: 151 g/mol, manufactured by DIC Corporation): 70 parts by mass

[Curing Accelerator]

1,8-Diazabicycloundecene (DBU) (manufactured by Kanto Chemical Co., Inc.): 1 part by mass

[Inorganic Filler]

Fumed silica: AEROSIL (registered trademark) R972 (trade name) (specific surface area: 110±20 $m^2/g$, manufactured by Nippon Aerosil Co., Ltd.): 8 parts by mass

[Solvent]

Methyl ethyl ketone

[Production of Metal Foil with Adhesive Layer and Laminated Sheet for Wiring Board with Adhesive Layer]

Example 2

On an adhesive surface (roughened surface) of an electrolytic copper foil having a width of 540 mm and a thickness of 3 μm (manufactured by Mitsui Mining & Smelting Co., Ltd., trade name: MT18Ex-3, surface roughness Rz of roughened surface: 2.0 μm), the varnish of the resin composition B for adhesive layer obtained in Production Example 2 was applied and dried at 190° C. for about 5 minutes such that the amount of the residual solvent was 1% by mass or less, thereby obtaining a copper foil with adhesive layer. A thickness of the formed organic adhesive layer was 3.0 μm.

Subsequently, the laminated sheet for wiring board with adhesive layer was produced as follows.

Copper layers (inner layer sheets) on the both surfaces of a cooper-clad laminated sheet (manufactured by Hitachi Chemical Co., Ltd., trade name: MCL-E-679FG(R), thickness: 0.4 mm) were roughened with a copper surface roughening liquid (manufactured by Mec Co., Ltd., trade name: CZ-8100). Subsequently, one sheet of a prepreg (manufactured by Hitachi Chemical Co., Ltd., trade name: GEA-679FG(R), thickness: 0.06 mm) was superimposed on each of the copper layers (inner layer sheets) of the both surfaces after roughening, and the above-obtained copper foil with adhesive layer was superimposed such that the surface on which the resin composition B for adhesive layer had been applied came into contact with the prepreg. On each of the both surfaces of this laminate, a mirror sheet and a cushioning paper were superimposed in this order and thermally cured using a press machine at 3.0 MPa and 185° C. for 1 hour, thereby obtaining a laminated sheet for wiring board with adhesive layer.

Example 3

A laminated sheet for wiring board with adhesive layer was produced in the same manner as in Example 2, except that in Example 2, the inorganic filler was changed to AEROSIL (registered trademark) R202 (trade name, specific surface area: 100±20 m²/g, manufactured by Nippon Aerosil Co., Ltd.).

Example 4

A laminated sheet for wiring board with adhesive layer was produced in the same manner as in Example 2, except that in Example 2, the blending amount of the inorganic filler was set to 10 parts by mass.

Reference Example 1

A laminated sheet for wiring board with adhesive layer was produced in the same manner as in Example 2, except that in Example 2, the inorganic filler was changed to spherical silica (manufactured by Admatechs Company Limited, trade name: SO-C1, specific surface area: 17 m²/g).

Reference Example 2

A laminated sheet for wiring board with adhesive layer was produced in the same manner as in Example 2, except that in Example 2, the blending amount of the inorganic filler was set to 25 parts by mass.

Subsequently, the obtained laminated sheets for wiring board with adhesive layer were subjected to the following evaluations. The results are shown in Table 1.

(Measurement of Plating Peel Strength)

The copper foils of the both surfaces of the laminated sheet for wiring board with adhesive layer obtained in each of the Examples was entirely etched and then dipped in ACTIVATOR NEOGANTH (registered trademark) 834 (trade name, manufactured by Atotech Japan K.K.) that is a catalyst for electroless plating containing $PdCl_2$ at 35° C. for 5 minutes. Subsequently, the resultant was dipped in PRINTGANTH (registered trademark) MSK-DK (trade name, manufactured by Atotech Japan K.K.) that is a plating liquid for electroless copper plating at room temperature for 15 minutes and further subjected to electrolytic plating with copper sulfate at a current density of 2 A/dm² for 90 minutes. Thereafter, the resultant was subjected to an annealing treatment at 170° C. for 30 minutes, to form a conductor layer having a thickness of 30 μm. The formed conductor layer was subjected to an etching treatment to form a conductor layer portion having a width of 10 mm and a length of 100 mm. A load was measured when one end of this was released at an interface between the circuit layer and the resin, gripped by a gripper, and then peeled off at room temperature in the vertical direction at a tensile rate of about 50 mm/min.

(Laser Processability and Cross-Section Observation)

In a necessary place of the laminated sheet for wiring board with adhesive layer obtained in each of the Examples, a via hole for interlayer connection was formed from the copper foil surface by means of direct laser processing. The via hole was formed by performing the processing using a laser processer, manufactured by Mitsubishi Electric Corporation (trade name: ML-605GTX) under conditions of a via diameter of 60 μm, a frequency of 500 Hz, a pulse width of 5 μs, a shot number of 3 shots, and a pulse energy of 0.8 mJ. Thereafter, the roughening treatment was performed in the same manner as in Example 2, and cross-section process was then performed to form a cross section of the via hole. The cross section of the via hole was observed with a scanning electron microscope (manufactured by Hitachi High-Technologies Corporation, trade name: S-2600N), thereby confirming the presence or absence of an undercut. In the cross section of the via hole, the case where the undercut was not generated was designated as "A", and the case where the undercut was generated was designated as "B".

TABLE 1

|  | Example 2 | Example 3 | Example 4 | Reference Example 1 | Reference Example 2 |
|---|---|---|---|---|---|
| Plating peel strength [kN/m] | 0.75 | 0.73 | 0.71 | 0.51 | 0.45 |
| Laser processability | A | A | A | A | A |

From the results of Table 1, it is noted that the laminated sheets produced in Examples 2 to 4 exhibit an excellent plating peel strength and have a high adhesion to the electroless copper plating. Furthermore, it is noted that in the via hole formed in the laminated sheet produced in each of Examples 2 to 4, the undercut is not generated, and good laser processability is revealed.

REFERENCE SIGNS LIST

1: Outer layer metal foil layer (metal foil)
2: Organic adhesive layer
3: Organic insulating resin layer
4: Inner layer circuit
5: Inner layer resin layer
6: Blind via hole
7: Outer layer copper layer
8: Circuit layer
9: Resist pattern
10: Pad
11: Outer layer circuit
12: Substrate with inner layer circuit
(A): BORING WITH LASER
(B): ETCHING
(C): ELECTROLESS COPPER PLATING
(D): RESIST PATTERN PRINTING
(E): ELECTROLYTIC PLATING
(F): RESIST PATTERN REMOVAL
(G): ETCHING

The invention claimed is:
1. A method of producing a multi-layered printed wiring board, comprising the following steps 1 to 3:
Step 1: a step of laminating a multilayer structure comprising, in order, a support, a metal foil and an organic adhesive layer, on a substrate with an inner layer circuit via an organic insulating resin layer, with the organic insulating resin layer being provided between the organic adhesive layer and the substrate with an inner layer circuit, the inner layer circuit having a thickness of 10 to 30 μm, the metal foil having a thickness of 3 μm or less and 1/10 to 1/6 relative to the thickness of the inner layer circuit, and the organic adhesive layer having a thickness of 1 to 10 μm, and then releasing the support to form a laminated sheet (a) having the metal foil as an outer layer metal foil layer;
Step 2: a step of irradiating the laminated sheet (a) with a laser to bore the outer layer metal foil layer, the organic adhesive layer, and the organic insulating resin layer to form a bored laminated sheet (b) having a blind via hole; and Step 3: a step of forming an outer layer circuit connected with the inner layer circuit through the following steps 3-1 to 3-4;

Step 3-1: a step of removing the outer layer metal foil layer of the bored laminated sheet (b) formed in the step 2 by etching and then forming an outer layer copper layer having a thickness of 0.1 to 2 μm on the bored laminated sheet (b);

Step 3-2: a step of forming a resist pattern by a resist applied on the outer layer copper layer;

Step 3-3: a step of forming a circuit layer on the surface of the outer layer copper layer on which the resist pattern is not formed, by electrolytic copper plating; and Step 3-4: a step of removing the resist pattern and then removing the exposed outer layer copper layer by etching, thereby forming an outer layer circuit connected with the inner layer circuit.

2. The method of producing a multi-layered printed wiring board according to claim 1, wherein a ten-point average surface roughness Rz of the surface of the metal foil on the side of the organic adhesive layer is 3.0 μm or less.

3. The method of producing a multi-layered printed wiring board according to claim 1, wherein a thermosetting resin composition containing an epoxy resin, a polymer component, an epoxy resin curing agent, a curing accelerator, and an inorganic filler having a specific surface area of $20$ $m^2/g$ or more, the content of the inorganic filler being 1 to 10 parts by mass based on 100 parts by mass of the epoxy resin, is used as the organic adhesive layer.

* * * * *